United States Patent
Ehrichs (12) 
(10) Patent No.: US 6,522,776 B1
(45) Date of Patent: Feb. 18, 2003

(54) METHOD FOR AUTOMATED DETERMINATION OF RETICLE TILT IN A LITHOGRAPHIC SYSTEM

(75) Inventor: Edward E. Ehrichs, Austin, TX (US)

(73) Assignee: Advanced Micro Devices, Inc., Sunnyvale, CA (US)

( * ) Notice: Subject to any disclaimer, the term of this patent is extended or adjusted under 35 U.S.C. 154(b) by 0 days.

(21) Appl. No.: 09/375,457

(22) Filed: Aug. 17, 1999

(51) Int. Cl.[7] .................................................. G06K 9/00
(52) U.S. Cl. ........................ 382/144; 382/151; 382/216; 250/311; 356/508
(58) Field of Search ................................. 382/141, 144, 382/149, 151, 165, 190, 199, 216, 270; 250/491.1, 306, 311, 492.2, 559.29; 356/508; 348/129; 430/30

(56) References Cited

U.S. PATENT DOCUMENTS

| | | | | |
|---|---|---|---|---|
| 5,216,235 A | * | 6/1993 | Lin ............................. | 250/306 |
| 5,300,786 A | * | 4/1994 | Brunner et al. .............. | 250/548 |
| 5,461,237 A | * | 10/1995 | Wakamoto et al. ......... | 250/548 |
| 5,568,563 A | * | 10/1996 | Tanaka et al. .............. | 382/144 |
| 5,989,764 A | * | 11/1999 | Adams ........................ | 430/30 |
| 6,093,511 A | * | 7/2000 | Tanaka et al. ........... | 250/491.1 |

* cited by examiner

Primary Examiner—Bhavesh Mehta
Assistant Examiner—Sheela Chawan
(74) Attorney, Agent, or Firm—Kevin L. Daffer; Conley, Rose & Tayon P.C.

(57) ABSTRACT

A method, system, and storage medium for determining retide tilt in a lithographic system is provided. Test patterns contained on a reticle are printed in a photoresist located on an upper surface of a semiconductor substrate by a lithographic system. The test patterns may include three posts of different diameters wherein one of the diameters is approximately equal to the minimum allowable feature size printable by the lithographic system. Images of the test patterns are measured by a scanning electron microscope under the control of a computer system. The computer system then assesses the measured images of the test patterns to determine if the reticle tilt is acceptable or unacceptable. In one embodiment, the computer system may assess the measured images by comparing the measured images to predetermined images of the test patterns for different focus conditions. The computer system may also calculate the amount of reticle tilt. In an alternative embodiment, the computer system may assess the measured images by comparing the measured images to each other.

27 Claims, 6 Drawing Sheets

METHOD FOR AUTOMATED DETERMINATION OF RETICLE TILT IN A LITHOGRAPHIC SYSTEM

BACKGROUND OF THE INVENTION

1. Field of the Invention

This invention relates to semiconductor processing and, more particularly, to a method, system, and storage medium for determination of reticle tilt in a lithographic system.

2. Description of the Relevant Art

Fabrication of integrated circuits upon semiconductor substrates ("wafers") involves numerous processing steps. For example, the fabrication of a metal-oxide-semiconductor ("MOS") integrated circuit includes the formation of trench isolation structures within a semiconductor substrate to separate each MOS field-effect transistor ("MOSFET") that will be made. The semiconductor substrate is typically doped with either n-type or p-type impurities. A gate dielectric, typically composed of silicon dioxide, is formed on the semiconductor substrate. For each MOSFET being made, a gate conductor is formed over the gate dielectric and a source and drain are formed by introducing dopant impurities into the semiconductor substrate. Conductive interconnect lines are then formed to connect the MOSFETs to each other and to the terminals of the completed integrated circuit. Modem high-density integrated circuits typically include multiple interconnect levels to provide all of the necessary connections. Multiple interconnect levels are stacked on top of each other with intervening dielectric levels providing electrical insulation between interconnect levels.

During integrated circuit fabrication, various structures, including the trench isolation structure, gate conductor, and interconnect lines, of the circuit are patterned, typically using optical lithography. Lithography is process whereby a pattern is transferred from a mask onto the semiconductor substrate. Lithography begins by applying a photosensitive material, often called photoresist, as a thin film to an upper surface of the wafer. Light is then projected onto the photoresist through the mask, which contains clear and opaque features that define a pattern to be created in the photoresist. The portions of the photoresist exposed to the light are rendered either soluble or insoluble in a specific solvent, often called developer. After the developer removes soluble portions of the photoresist, the remaining photoresist forms a mask that may be used in patterning layers of the wafer underneath the photoresist. For example, the photoresist may be used to protect the covered portions of the semiconductor substrate while the exposed portions of the semiconductor substrate are etched.

One commonly used lithographic system is the step and repeat projection system in which the mask, referred to as a reticle, can pattern only a portion of the photoresist. The step and repeat system projects a pattern of the reticle onto a portion of the semiconductor substrate. The system then moves the semiconductor substrate and projects the pattern of the reticle onto a different portion of the semiconductor substrate. This process is repeated until the reticle's pattern has been projected onto the entirety of the semiconductor substrate. Since multiple, identical integrated circuits are manufactured on the large diameter (typical diameter—200 mm) semiconductor substrates used in modern integrated circuit fabrication, the reticle will pattern a portion of the photoresist corresponding to one or more circuits. For example, the reticle may pattern four seperate die simultaneously. Step and repeat projection system also often have lenses placed between the reticle and the semiconductor substrate such that the pattern projected onto the photoresist is smaller than the pattern of the reticle. Pattern reduction of a factor of five is common.

A prevalent trend in modern integrated circuit fabrication is reducing the size of circuit structures, such as gate conductors and interconnect lines, to permit circuits of greater complexity to be manufactured without substantially increasing the area occupied by the circuit. This continuing reduction in size places ever greater demands on the lithography system to increase its resolution. Rayleighs criterion defines the minimum distance between two features in the pattern that are resolvable: Two separate features are resolvable if $2d=0.61 \ \lambda/NA$ where $2d$ is the distance between the features, $\lambda$ is the wavelength of the of light projected by the lithographic system, and NA is the numerical aperture of the lens that focuses light from the reticle onto the photoresist. Resolution is typically increased (i.e., reducing $2d$) by either decreasing the wavelength of light used or by increasing the numerical aperture of the lens.

Depth of focus is another critical property of the lithographic system. Depth of focus refers to the ability to focus light over only a limited focal plane. Depth of focus $\sigma$ is given by $\sigma=\lambda/(NA)^2$ where $\lambda$ is the wavelength of the of light and NA is the numerical aperture of the lens as before. Improvements in the resolution of the lithographic system by decreasing the wavelength or increasing the numerical aperture unfortunately results in a decrease of the depth of focus. Modern step and repeat projection system, which typically use light with wavelengths of 365 nm (I-line) or 248 nm (deep UV) and have numerical apertures greater than 0.6, often have a depth of focus of less than 1 $\mu$m.

If any portion of the photoresist is outside of the focal plane of the lithographic system, that portion of the photoresist will be improperly exposed resulting in incomplete transfer of the reticle pattern onto the photoresist. The developed photoresist will therefore not have the desired pattern and the photoresist may not protect the proper portions of the underlying semiconductor substrate when the photoresist is used as a mask. For example, if the photoresist is being used to mask a metal layer that is being etched to form interconnects, a defective mask may result in two interconnects being shorted or may result in an interconnect having a width less than that targeted and therefore a current carrying capacity less than that targeted. Both situations may lead to failure of the integrated circuit being manufactured. In general, underexposure of the photoresist will decrease the yield of the fabricated integrated circuits and increase the costs of manufacturing. The yield is defined as the percentage of completed integrated circuits manufactured that are functional.

The limited depth of focus of modem lithographic systems requires extremely tight tolerances on the positioning of all components in the system including the reticle and semiconductor substrate. For example, both the upper surface of the semiconductor substrate and the photoresist layer must be planar. Also, both the reticle and semiconductor must be positioned the correct distances from one another. Additionally, if the reticle is tilted, portions of the photoresist may be outside of the focal plane and those portions may therefore be underexposed. Having one side of the reticle out of position by as little as 0.3 $\mu$m may result in an unacceptable amount of reticle tilt. In general, modem lithographic systems have the ability to precisely adjust the position and tilt of the reticle.

To aid in verifying proper performance of the lithographic system, test patterns are typically included on reticles in addition to patterns corresponding to the circuit being manufactured. The test patterns are arranged on the reticle such that the test patterns formed in the photoresist are in areas of the semiconductor substrate external to areas of the semiconductor substrate in which circuits are being fabricated. Examination of the test patterns on the semiconductor substrate after development of the photoresist can yield information about the performance of the lithographic system.

An unacceptable amount of reticle tilt is generally checked for by examining multiple test patterns on the semiconductor substrate. Due to their small size, test patterns are typically imaged using a scanning electron microscope. If every test pattern has the correct shape, the reticle is considered to positioned correctly; whereas, if one or more of the test patterns do not have the correct shape, the reticle is considered to have an unacceptable amount of reticle tilt. The shape of the test pattern refers to the three dimensional structure of the test pattern. The imaging and assessment of the test patterns is generally done manually by an operator. If an unacceptable reticle tilt is found, the position of the reticle in the lithographic system must be adjusted.

Since the manual process of imaging and assessing the test patterns is relatively slow and time consuming, it is typically done only on representative semiconductor substrates. Often reticle tilt may be checked only once a day. If the reticle tilt drifts over the course of the day, many semiconductor substrate can be processed by the lithographic system before the reticle tilt is discovered. These improperly processed semiconductor substrates may exhibit decreased yield and therefore result in increased costs of manufacturing. Additionally, the yield may not be decrease but the appearance of the completed circuit may be unappealing to the customer who purchases the circuit.

Additionally, since the assessment of the test patterns is performed manually, the assessment may include operator bias. For instance, different operators may assess similar test patterns differently. Additionally, the same operator assessment of similar test patterns may change over time. In either case, the possibility exists that in some cases unacceptable reticle tilt may go unnoticed resulting in decreased yield and increased manufacturing costs.

It is therefore desirable to develop an improved method for quickly determining if an unacceptable amount of reticle tilt is present. A quicker determination of reticle tilt would allow the reticle tilt to be checked more often thereby minimizing the quantity of semiconductor substrates processed by the lithographic system with an unacceptable amount of reticle tilt. It is also desirable to remove operator bias from the determination of reticle tilt so that similar test patterns always result in the same assessment of reticle tilt and unacceptable reticle tilt will not go unnoticed.

SUMMARY OF THE INVENTION

The problems outlined above are in large part addressed by a method in which images of test patterns located on a semiconductor substrate are automatically measured by a scanning electron microscope, transferred to a computer system, and are assessed by the computer system to determine if there is an unacceptable amount of reticle tilt. Automatic measurement of test pattern images by the scanning electron microscope and assessment of the measured images by the computer system advantageously increases the speed at which detection of reticle tilt may be accomplished. Since automatic assessment of test patterns can be accomplished quicker, the frequency with which the test patterns are assessed may also be increased. More frequent assessment of test patterns for the presence of unacceptable reticle tilt may reduce the quantity of semiconductor substrates processed by the lithographic system before the unacceptable reticle tilt is discovered. Additionally, utilization of a computer system to assess the images of the test patterns removes any operator bias from the process and assures that similar test patterns will always be assessed identically.

The measurement of the images by the scanning electron microscope is preferably controlled by the computer system. The computer-controlled process includes loading the semiconductor substrate, on which the test patterns are located, into the scanning electron microscope. The position of the semiconductor substrate is then adjusted such that the approximate location of one of the test patterns is within a field of view of the scanning electron microscope. The test pattern is then located and centered within the field of view of the scanning electron microscope. Finally, an image of the test pattern is sent to the computer system. The process may be repeated for each of the remaining test patterns.

Once the computer system has received the images of the test patterns, the computer system may assess the images to determine whether the reticle tilt is acceptable or unacceptable. In one embodiment, the computer system may compare the measured images of each test pattern to predetermined images of the test pattern for different focus conditions. Different focus conditions are the result of different positions of the reticle within the lithographic system. Changing the position of the reticle will change the position at which an image of the reticle's pattern will form. Each of the different focus conditions are predetermined to be either acceptable or unacceptable. The computer system finds the predetermined image that best matches each of the measured images. If the computer system finds that each measured image of the test patterns best matches with a predetermined image that corresponds to acceptable focus conditions, the computer system determines that the reticle tilt is acceptable. However, if the computer system finds that at least one of the measured images of the test patterns best matches with a predetermined image that corresponds to unacceptable focus conditions, the computer system determines that the reticle tilt is unacceptable. If the reticle tilt is determined to be unacceptable, the computer system may then notify an operator of the lithographic system and/or may signal a computer, which controls the lithographic system, to take the lithographic system offline, so that correction of the reticle tilt may be accomplished.

In an additional embodiment, the computer system may also calculate the amount of reticle tilt. The computer system may inform an operator of the calculated amount of reticle tilt. The operator may then adjust the position of the reticle within the lithographic system such that the tilt is removed. The computer system may calculate the amount of reticle tilt based upon the focus conditions, which correspond to a specific reticle position, of the predetermined images that best matches each of the measured images.

In an alternative embodiment, the computer system may compare a first image of the measured images to the other measured images to determine whether the reticle tilt is acceptable or unacceptable. If the reticle is not tilted, all the measured images should be essentially identical. The greater the amount of reticle tilt, the more dissimilar the measured images will be. The computer system determines a degree to which the first measured image matches the other measured images. If the first measured image matches the other measured images to within a predetermined amount, the computer system determines the reticle tilt to be acceptable. If the first measured image does not match at least one of the other measured images to within the predetermined amount, the computer system determines the reticle tilt to be unacceptable. As with the previous embodiment, if the reticle tilt is determined to be unacceptable, the computer system may then notify an operator of the lithographic system and/or may signal a computer, which controls the lithographic system, to take the lithographic system offline, so that correction of the reticle tilt may be accomplished.

In addition to the method described above, a system is contemplated herein. The system comprises a computer system connected to a scanning electron microscope. A database on the computer system maintains a record of measured and predetermined images of test patterns. A program executing on the computer system can control the scanning electron microscope such that images of test patterns on a semiconductor substrate are measured. In one embodiment, the program may then compare the measured images and the predetermined images to determine the reticle tilt to be acceptable or unacceptable. The program may also calculate the amount of reticle tilt. In another embodiment, the program may compare the measured images to each other to determine the reticle tilt to be acceptable or unacceptable. Additionally, the program may display the measured images of the test patterns on an output device, such as a monitor or printer, so that an operator may independently assess the measured images.

A computer-readable storage medium is also contemplated herein. The storage medium contains program instructions that can be implemented by an executable unit to control a scanning electron microscope and assess measured images of test patterns. The storage medium includes measured and predetermined test pattern image data. The measured test pattern image data corresponds to images of test patterns on a semiconductor substrate measured by the scanning electron microscope. The predetermined test pattern image data corresponds to predetermined images of the test pattern for different focus conditions. In one embodiment, the instructions cause the executable unit to compare the measured images to the predetermined images and to determine if the reticle tilt is acceptable or unacceptable. The instruction may also cause the executable unit to calculate the amount of reticle tilt. In an additional embodiment, the instructions cause the executable unit to compare the measured images to each of the predetermined images to determine if the reticle tilt is acceptable or unacceptable. In another embodiment, the instructions cause the executable unit to compare the measured images to each other to determine if the reticle tilt is acceptable or unacceptable.

BRIEF DESCRIPTION OF THE DRAWINGS

Other objects and advantages of the invention will become apparent upon reading the following detailed description and upon reference to the accompanying drawings in which.

While the invention is susceptible to various modifications and alternative forms, specific embodiments thereof are shown by way of example in the drawings and will herein be described in detail. It should be understood, however, that the drawings and detailed description thereto are not intended to limit the invention to the particular form disclosed. On the contrary, the intention is to cover all modifications, equivalents, and alternatives falling within the spirit and scope of the present invention.

DETAILED DESCRIPTION OF THE PREFERRED EMBODIMENTS

Figure 1:
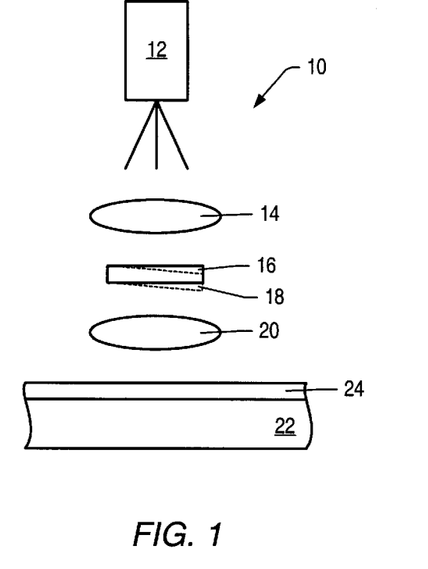
FIG. 1 is an exemplary cross-sectional side-view schematic of a lithographic system for transferring a pattern located on a reticle onto a photoresist layer located on a semiconductor substrate.

Turning now to the drawings, FIG. 1 shows a cross-sectional side-view schematic of a lithographic system and a portion of a semiconductor substrate on which patterns are being printed. Lithographic system 10 is a step and repeat projection system. Light source 12 projects light through lens 14, reticle 16, and lens 20 onto photoresist 24 that is located on an upper surface of semiconductor substrate 22. Previous to placing semiconductor substrate in lithographic system 10, photoresist 24 is applied to semiconductor substrate 22 by, for example, spin coating. The light from light source 12 is preferably from the ultraviolet portion of the electromagnetic spectrum. Light source 12 may be, for example, a mercury-vapor lamp or an excimer laser. Reticle 16 includes clear and opaque regions that define a pattern that is desired to be created in photoresist 24. Lens 20 may reduce the size of the pattern of reticle 16 projected onto photoresist 24 by, for example, a factor of five. The pattern of reticle 16 includes both circuit patterns, which define the circuit being fabricated, and test patterns, which may be used to verify proper operation of lithographic system 10. Exposure of portions of photoresist 24 to the light changes the solubility of those portions in a developer.

The area of the pattern projected onto photoresist 24 is less than the area of semiconductor substrate 22. To project the pattern of reticle 16 onto other portions of photoresist, lithographic system 12, moves semiconductor substrate 22, projects the pattern onto a different portion of photoresist 24, and repeats this procedure until the pattern has been projected onto all of photoresist 24. After all of photoresist 24 has been patterned, semiconductor substrate is removed from lithographic system 10, and the pattern printed on photoresist 24 is developed by spraying the developer onto photoresist 24. For example, if photoresist 24 is a positive photoresist, the developer removes portions of photoresist 24 that have been exposed to light by lithographic system 10.

If reticle 16 is not positioned correctly, photoresist 24 may be outside of the focal plane of lithographic system 10 and may therefore be poorly defined due to the limited depth of focus of lithographic system 10. Poor definition may result in improper transfer of the pattern of reticle 16 onto photoresist 24 and may ultimately lead to failure of the integrated circuit being fabricated. For example, if lithographic system 10 uses the standard wavelengths of 365 nm (I-line) or 248 nm (deep UV), the depth of focus may be less than 1 $\mu$m and a positioning error as small as 0.3 $\mu$m of reticle 16 may cause underexposure of photoresist 24. Additionally, reticle 16 may be tilted such that only portions of reticle 16 are positioned incorrectly. An exaggerated example of reticle tilt is shown in FIG. 1 by reticle 18 which is depicted in phantom. If the pattern of reticle 18 is projected onto photoresist 24, portions of the pattern on the right-hand side of reticle 18 may be underexposed on photoresist 24.

Figure 2:
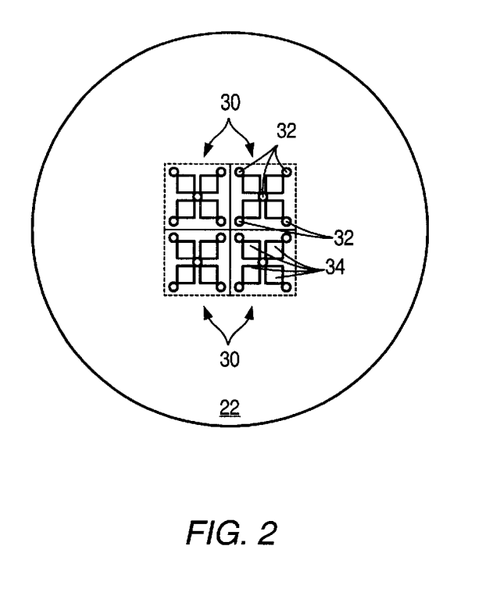
FIG. 2 is an exemplary plan view of an upper surface of the semiconductor substrate showing the location of circuit patterns and test patterns.

FIG. 2 depicts an upper surface of semiconductor substrate 22, after development of photoresist 24. Reticle pattern 30 is the pattern projected from reticle 16 onto photoresist 24. Although only four copies of reticle pattern 30 is shown, reticle pattern 30 is preferably repeated such that is covers all of the upper surface of substrate 22. Reticle pattern 30 is shown to include five test patterns 32 and four circuit patterns 34. The quantity and placement of test patterns 32 and circuit patterns 34 may vary. Generally, the number of circuit patterns 34 in pattern 30 will depend on the size of circuit pattern 34 relative to the size of reticle 16. Test patterns 32 may be examined to determiner if any tilt of reticle 16 had been present in lithographic system 10. For example, if reticle 18 was used to print pattern 30, test patterns 32 on the left-hand side of pattern 30 may not be properly formed.

Figure 3:
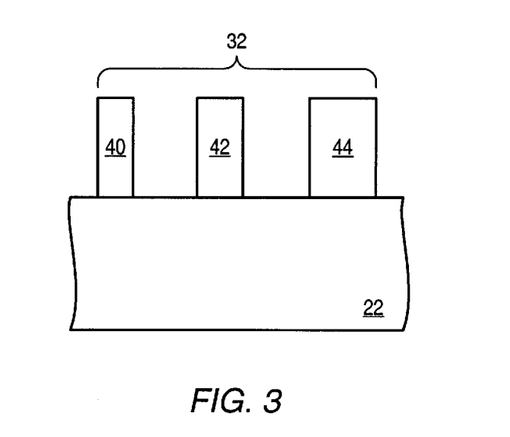
FIG. 3 is an exemplary partial cross-sectional side-view of the semiconductor substrate on which a test pattern is located.

FIG. 3 illustrates a partial cross-sectional side view of semiconductor substrate 22 that includes a portion of test pattern 32. Test pattern 32 is composed of the portions of photoresist 24 remaining after development. Although test pattern 32 is shown as including posts 40, 42, and 44, test pattern 32 could include lines, vias, or other structures. A diameter of post 42 in test pattern 32 may be approximately equal to a minimum allowable feature size printable by lithographic system 10 in circuit pattern 34. The minimum allowable feature size may be, for example, 0.25 $\mu$m. A diameter of post 40 is preferably less than the diameter of post 42 while a diameter of post 44 is preferably greater than post 44. Test pattern 32 is shown assuming reticle 16 is properly positioned in lithographic system 10.

Figure 4:
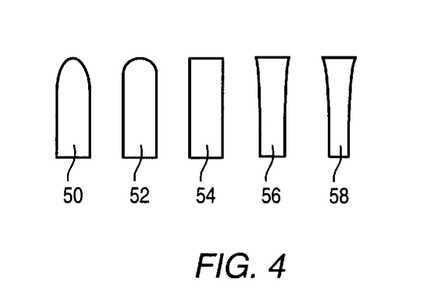
FIG. 4 is an exemplary cross-sectional side-view of a portion of the test pattern of FIG. 3 for different focus conditions.

FIG. 4 shows examples of the shape of post 40 for different focus conditions (i.e., different positions of reticle 16). In general, reticle tilt may be discerned easiest from the shape of post 40 since that post has the smallest diameter. Shape 54 indicates a good focus condition or, in other words, that a portion of reticle 16 containing test pattern 32 is positioned correctly. Shapes 52 and 56 indicate slightly worse focus conditions or, stated alternatively, that the portion of reticle 16 containing test pattern 32 is slightly out of position. Shapes 50 and 58 indicate even worse focus conditions or, said otherwise, that the portion of reticle 16 containing test pattern 32 is even more out of position. It may be decided, for example, that shapes 52, 54, and 56 indicate acceptable focus conditions while shape 50 and 58 indicate unacceptable focus conditions. Unacceptable focus conditions may mean that circuit patterns 34 will be formed such that completed integrated circuits will exhibit a low yield or may mean that the cosmetic appearance of circuit patterns 34 will be such that customers who purchase the completed integrated circuits will be dissatisfied. Acceptable focus conditions may mean that circuit patterns 34 will be formed such that completed integrated circuits will exhibit a high yield or may mean that the cosmetic appearance of the completed integrated circuit will be satisfactory to customers.

Figure 5:
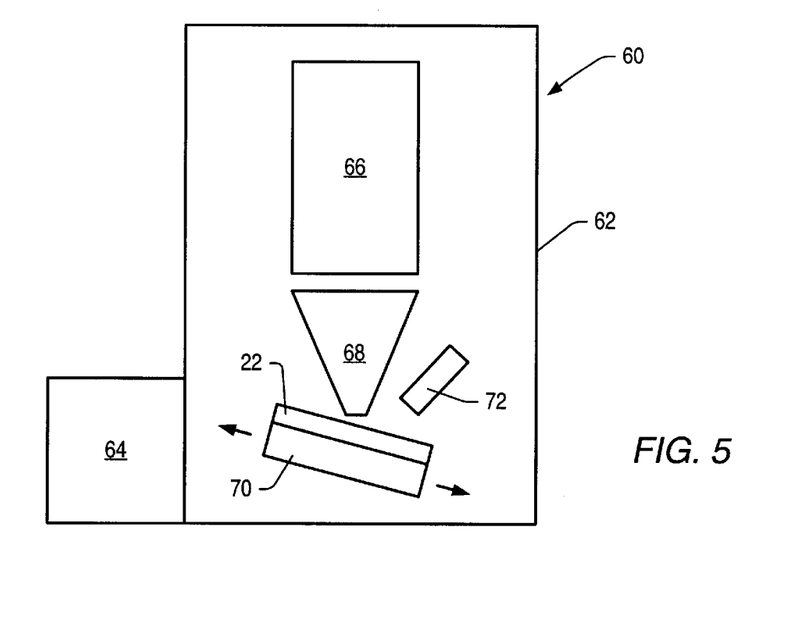
FIG. 5 is a cross-sectional side-view schematic of a scanning electron microscope.

Since the test patterns are relatively small (for example, less than 1 $\mu$m), examination of the test patterns requires some form of magnification. A preferred device for magnifying the test patterns is a scanning electron microscope which uses a focused electron beam to create a magnified image of a surface. FIG. 5 depicts a cross-sectional sideview schematic of a scanning electron microscope. An example of a scanning electron microscope is the SEMVision™ manufactured by Applied Materials, Inc. of Santa Clara, Calif. Scanning electron microscope 60 is contained within vacuum chamber 62. Load lock 64 allows semiconductor substrate 22 to be introduced into vacuum chamber 62 and placed on stage 70. Electron column 66 generates a focused electron beam and deflection system 68 may raster the electron beam across a portion of semiconductor substrate 22. Typical electron beam energies may range from 0.5 to 40 keV. Secondary electrons emitted from the surface of semiconductor substrate 22 are detected by detector 72. The output of detector 72 is used to modify an intensity of the image as a function of electron beam location. Images of the surface magnified by a factor of 10 to 100,000 are typically produced by scanning electron microscopes. Deflection system 68 is typically only able to raster the electron beam over a limited area of semiconductor substrate 22 such that only a portion of semiconductor substrate is within a field of view of scanning electron microscope 60. To image other portions of semiconductor substrate 22, stage 70 may move semiconductor substrate 22 to bring different portions of semiconductor substrate 22 underneath deflection system 68 and within the field of view of scanning electron microscope 60.

Figure 6:
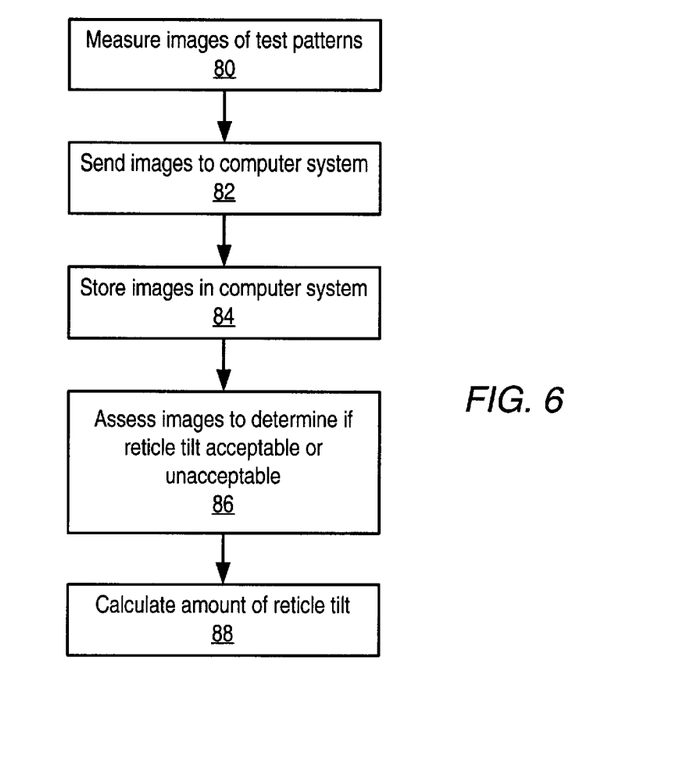
FIG. 6 is a flow diagram for an exemplary procedure for determining reticle tilt.

FIG. 6 shows a flow diagram for a procedure for determining reticle tilt according to some embodiments of the method recited herein. Initially, images of test patterns on a semiconductor substrate are measured using a scanning electron microscope (box 80). The scanning electron microscope is preferably under the control of a computer system. The images measured by the scanning electron microscope are then sent to the computer system (box 82). The computer system then stores a copy of the image in an appropriate storage medium such as a hard disk (box 84). The stored images may be retrieved by interested personnel at any time for review. The computer system may assess the images to determine if the reticle tilt is acceptable or unacceptable (box 86). As an additional embodiment, the computer system may also calculate the amount of reticle tilt (box 88).

Figure 7:
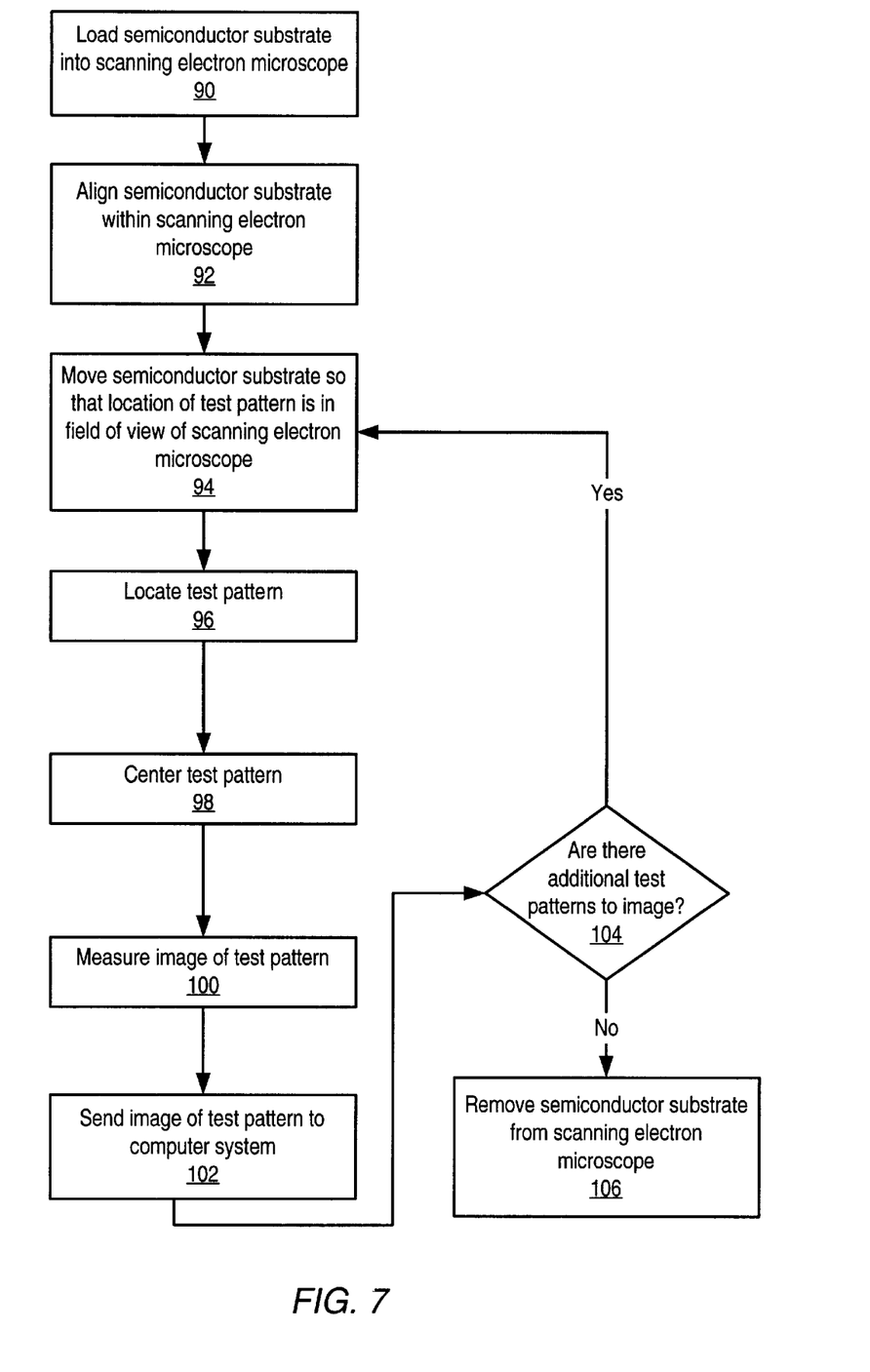
FIG. 7 is a flow diagram for an exemplary procedure for measuring images of test patterns on the semiconductor substrate using a scanning electron microscope.

FIG. 7 depicts a flow diagram for an exemplary procedure for measuring images of test patterns using a scanning electron microscope. Initially, a semiconductor substrate containing test patterns is loaded into a scanning electron microscope (box 90). The semiconductor substrate is then aligned within the scanning electron microscope (box 92). The semiconductor substrate is then moved by the scanning electron microscope such that an approximate location of one of the test patterns is in a field of view of the scanning electron microscope (box 94). The test pattern is then located (box 96) and centered (box 98) within the field of view of the scanning electron microscope. The test pattern is then imaged by the scanning electron microscope (box 100) and the measured image is sent to the computer system (box 102). The computer system may save the image such that it can by analyzed by the computer system. The process outline above is then repeated until images of all test patterns on the semiconductor substrate are measured (box 104). For example, all five test patterns 32 for one of patterns 30 are measured by the scanning electron microscope for semiconductor substrate 22 in FIG. 2. Once images of all test patterns have been measured, the semiconductor substrate may be removed from the scanning electron microscope (box 106).

Figure 8:
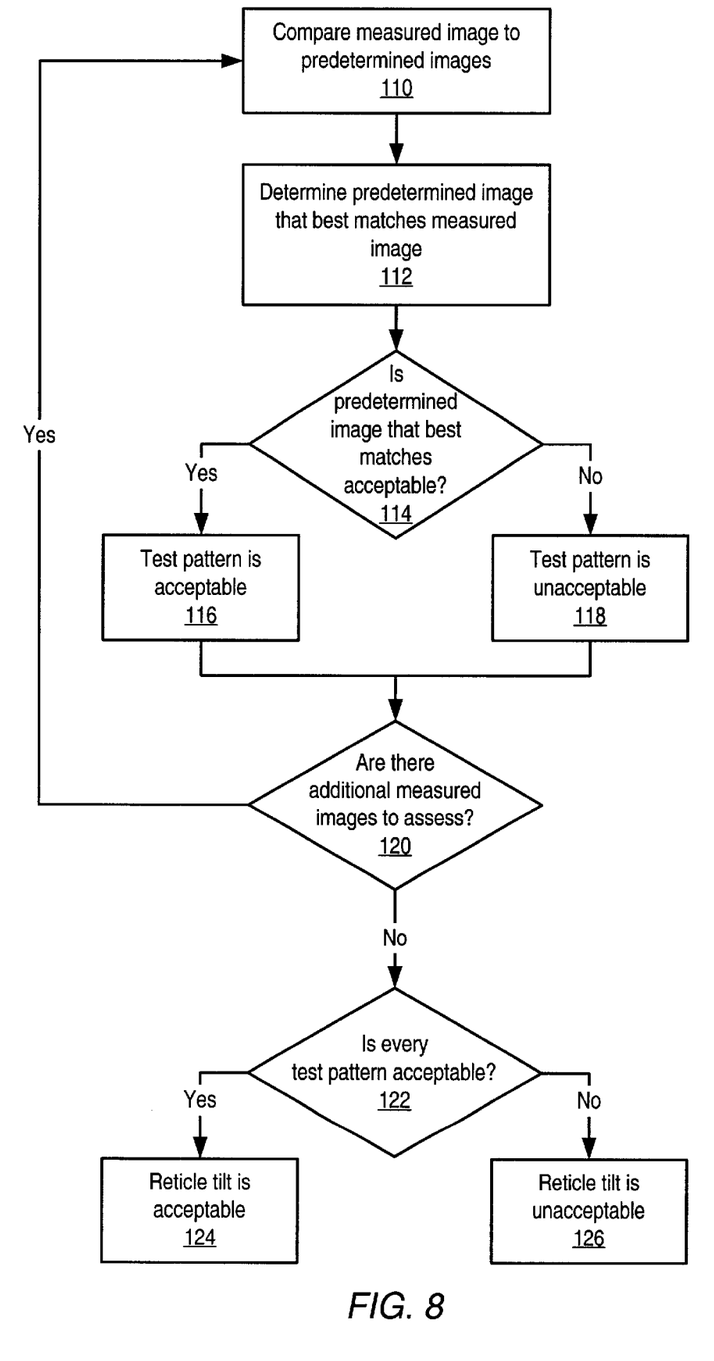
FIG. 8 is a flow diagram for an exemplary procedure for assessing the measured images of the test patterns to determine the reticle tilt to be acceptable or unacceptable according to one embodiment of the method recited herein.

FIG. 8 shows a flow diagram for an exemplary procedure according to one embodiment for determining if a reticle tilt is acceptable or unacceptable based upon images of test patterns on a semiconductor substrate measured by a scanning electron microscope. Initially, one of the measured images is compared to a plurality of predetermined images (box 110). For example, if the test pattern is test pattern 32 shown in FIG. 3, the plurality of predetermined images may include shapes 50 to 58 in FIG. 4. The computer program determines which of the predetermined images best matches the measured image (box 112). The computer program then checks to see if the predetermined image that best matches the measured image corresponds to focus conditions of the lithographic system that are predetermined to be acceptable or unacceptable (box 114). If the predetermined image corresponds to acceptable focus conditions, then the measured test pattern is acceptable (box 116); otherwise, the measured test pattern image is unacceptable (box 118).

The procedure for determining if the test pattern is acceptable is repeated for every test pattern imaged on the semiconductor substrate (box 120). For example, there are preferably measured images for all five test patterns 32 for one of patterns 30 for semiconductor substrate 22 in FIG. 2. After all the measured images have been assessed, the computer checks if every test pattern from the semiconductor substrate has been determined to be acceptable (box 122). If all the test patterns are determined to be acceptable, the reticle tilt is acceptable (box 124); otherwise, the reticle tilt is unacceptable (box 126).

Figure 9:
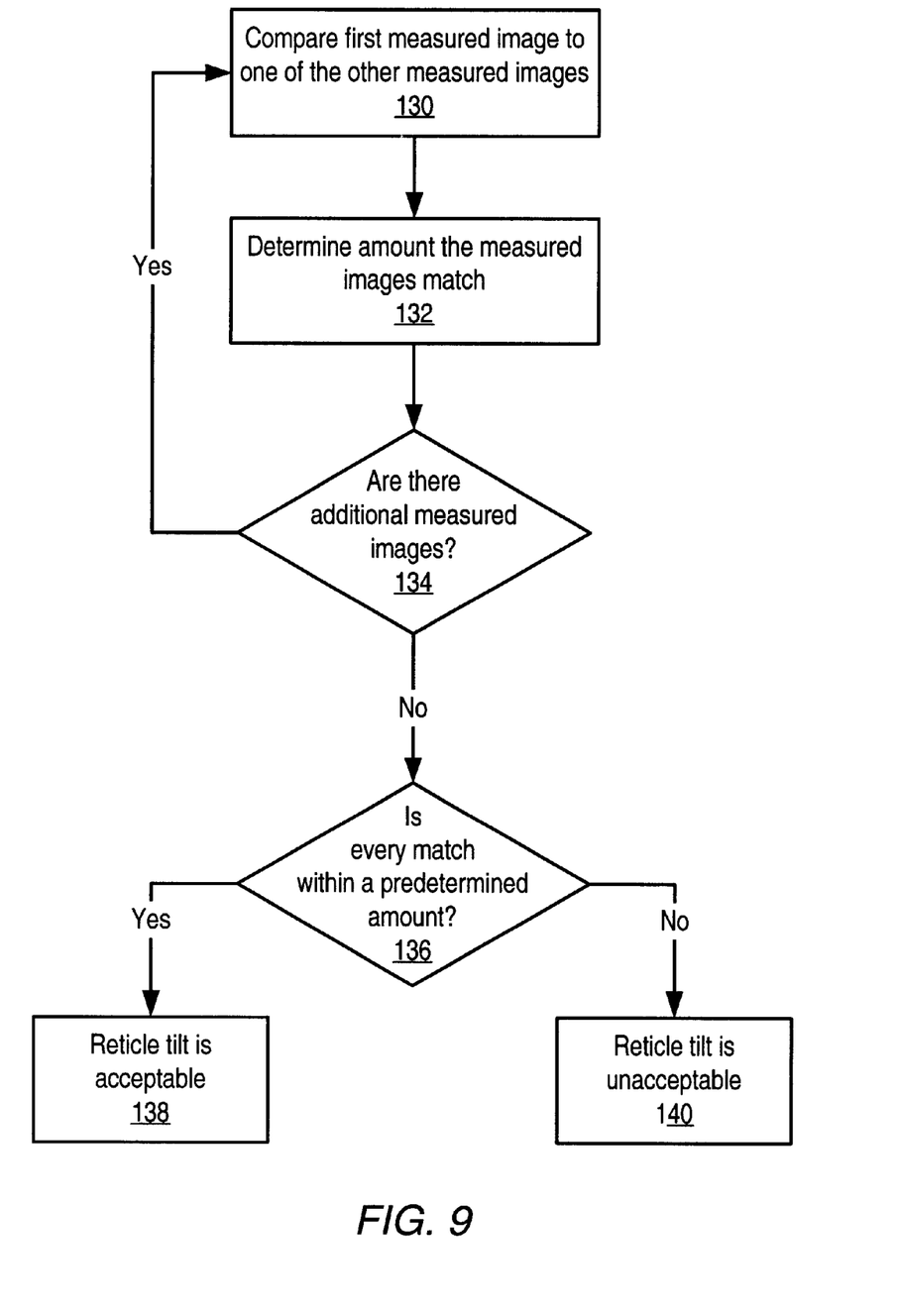
FIG. 9 is a flow diagram for an exemplary procedure for assessing the measured images of the test patterns to determine the reticle tilt to be acceptable or unacceptable according to an alternative embodiment of the method recited herein.

FIG. 9 shows a flow diagram for an exemplary procedure according to an alternative embodiment for determining if a reticle tilt is acceptable or unacceptable based upon images of test patterns on a semiconductor substrate measured by a scanning electron microscope. Initially, a first image of the measured images is compared to one of the other measured images (box 130). For example, for reticle pattern 30 in FIG. 2, the first measured image may be of test pattern 32 in the center of reticle pattern 30 and one of the other measured images may be any one of the remaining four test patterns 32 in reticle pattern 30. The computer program then determines the amount the first measured image matches the other measured image (box 132). This procedure is repeated until the first measured image has been compared to all of the other measured images (box 134). The computer system then determines if every match is within a predetermined amount (box 136). If the first image matches all of the other measured images to within the predetermined amount, the reticle tilt is acceptable (box 138); otherwise, the reticle tilt is unacceptable (box 140).

Figure 10:
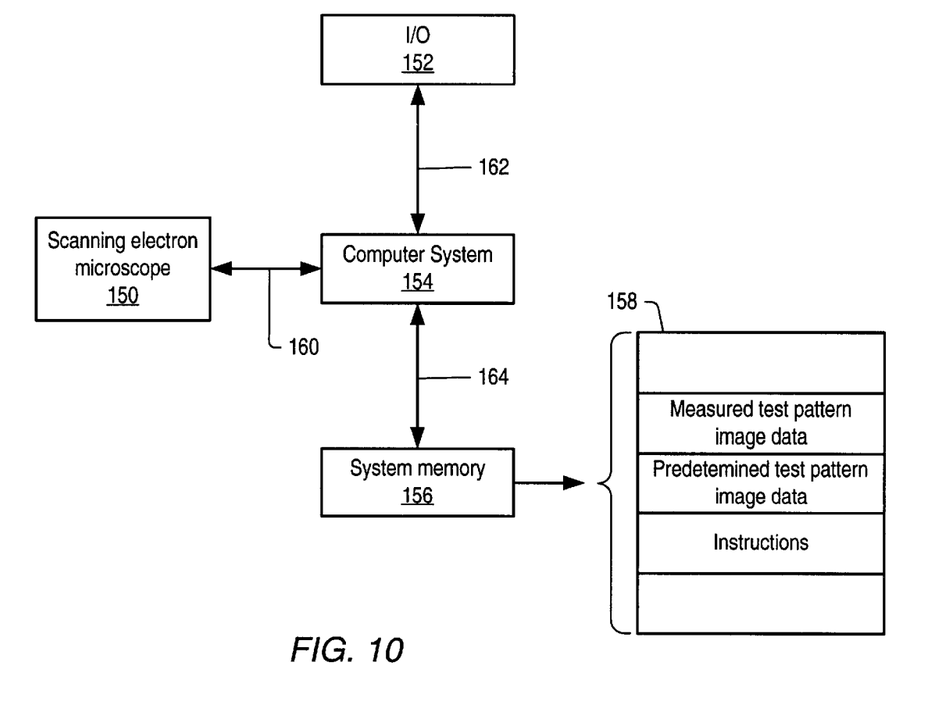
FIG. 10 is an exemplary block diagram of the interconnection of a scanning electron microscope and a computer system.

FIG. 10 illustrates an exemplary block diagram for the interconnection of a scanning electron microscope and a computer system. Scanning electron microscope 150 is connected to computer system 154 by two-way bus 160. Additionally, computer system 154 is connected to I/O unit 152 by bus 162 and system memory 156 by local bus 164. I/O unit 152 may include a monitor and/or a printer for an operator to review measured test pattern images and to receive reticle tilt determination information. System memory 156 is either a volatile or non-volatile storage medium which can include a hard disk, a floppy disk, a read-only memory, and/or a random access memory in which data and instruction are stored. A portion of the information stored in system memory 156 is shown in memory address space 158. The information in memory address space 158 includes instructions and a database that contains measured and predetermined test pattern image data.

An execution unit in computer system 154 can control scanning electron microscope 150 and can receive measured test pattern images from scanning electron microscope 150 and store them in memory address space 158. In one embodiment, the execution unit can execute the instructions located in memory address space 158 to fetch the measured and predetermined test pattern image data and compare them to determine which predetermined test pattern image best matches each of the measured test pattern images. If all of the measured test pattern images best match predetermined test pattern images that correspond to focus conditions that are predetermined to be acceptable, the instructions cause the execution unit to determine the reticle tilt to be acceptable; otherwise, the instructions cause the execution unit to determine the reticle tilt to be unacceptable. The instructions may also be used by the execution unit to use I/O unit 152 to inform an operator of the determination of the reticle tilt or allow the operator to view the measured test pattern images through I/O unit 152. Additionally, the instructions may also be used by the execution unit to calculate the amount of reticle tilt.

In an alternative embodiment, the execution unit can execute the instructions located in memory address space 158 to fetch the measured test pattern image data and compare the measured images to each other. If all of the measured images match each other to within a predetermined amount, the instructions cause the execution unit to determine the reticle tilt to be acceptable; otherwise, the instructions cause the execution unit to determine the reticle tilt to be unacceptable.

It will be appreciated to those skilled in the art having the benefit of this disclosure that this invention is believed to provide a method for determination of reticle tilt in a lithographic system. Further modifications and alternative embodiments of various aspects of the invention will be apparent to those skilled in the art in view of this description. For example, two computer systems may be used in which a first computer system controls the scanning electron microscope and a second computer system assess the measured images of test patterns to determine reticle tilt. It is intended that the following claims are interpreted to embrace all such modifications and changes and, accordingly, the specification and drawings are to be regarded in an illustrative rather than a restrictive sense.

What is claimed is:

1. A method for determination of reticle tilt, comprising:

measuring an image for each of a plurality of test patterns located on a semiconductor substrate using a scanning electron microscope controlled by a program running on a computer system linked to the scanning electron microscope; and determining the reticle tilt to be acceptable or unacceptable by the program, wherein said determining comprises comparing each of the measured images to predetermined images of the test pattern for different focus conditions.

2. The method of claim 1, further comprising, using a lithographic system, transferring a pattern from the reticle onto a photoresist located on an upper surface of the semiconductor substrate, wherein the pattern includes the test patterns, and wherein the test patterns comprise portions of the photoresist after development of the photoresist.

3. The method of claim 2, wherein each of the test patterns comprises three posts of different diameters, and wherein a first diameter is approximately equal to a minimum allowable feature size printable by the lithographic system, a second diameter is less than the first diameter, and a third diameter is greater than the first diameter.

4. The method of claim 1, wherein said measuring the image comprises loading the semiconductor substrate into the scanning electron microscope, aligning the semiconductor substrate within the scanning electron microscope, and for each of the test patterns to be measured:

adjusting a position of the semiconductor substrate such that the approximate location of the test pattern is within a field of view of the scanning electron microscope;

locating the test pattern on the semiconductor substrate;

centering the test pattern within the field of view of the scanning electron microscope; and sending the image of the test pattern to the computer system.

5. The method of claim 1, wherein said comparing comprises finding the predetermined image that best matches the measured image, and wherein each of the focus conditions is predetermined to be acceptable or unacceptable.

6. The method of claim 1, wherein both the measured and predetermined images are stored within the computer system.

7. The method of claim 5, wherein said comparing finds that each of the measured images best matches one of the predetermined images corresponding to acceptable focus conditions, and wherein the reticle tilt is determined to be acceptable based upon said comparing.

8. The method of claim 5, wherein said comparing finds that at least one of the measured images best matches one of the predetermined images corresponding to unacceptable focus conditions, and wherein the reticle tilt is determined to be unacceptable based upon said comparing.

9. The method of claim 5, further comprising calculating an amount of reticle tilt by the program based upon reticle positions that result in the focus conditions of the predetermined images that best matches each of the measured images.

10. The method of claim 1, wherein said determining the reticle tilt to be acceptable or unacceptable comprises comparing a first image of the measured images to the other measured images.

11. The method of claim 10, wherein said comparing finds that the first measured image matches the other measured images to within a predetermined amount, and wherein the reticle tilt is determined to be acceptable based upon said comparing.

12. The method of claim 10, wherein said comparing finds that the first measured image does not match at least one of the other measured images to within a predetermined amount, and wherein the reticle tilt is determined to be unacceptable based upon said comparing.

13. A system for determining reticle tilt, comprising:

a computer system;

a scanning electron microscope linked to the computer system for sending a measured image for each of a plurality of test patterns located on a semiconductor substrate;

a database, stored within the computer system, adapted for maintaining records comprising measured images and for maintaining records comprising predetermined images of the plurality of test patterns for different focus conditions; and a program, adapted for execution on the computer system, to control the scanning electron microscope and to determine the reticle tilt to be acceptable or unacceptable depending on the measured images.

14. The system of claim 13, wherein each focus condition is predetermined to be acceptable or unacceptable.

15. The system of claim 13, wherein the program compares each of the measured images to the predetermined images to find the predetermined image that best matches each of the measured images.

16. The system of claim 15, wherein each of the measured images best matches one of the predetermined images corresponding to an acceptable focus condition, and wherein the program determines the reticle tilt to be acceptable.

17. The system of claim 15, wherein at least one of the measured images best matches one of the predetermined images corresponding to unacceptable focus conditions, and wherein the program determines the reticle tilt to be unacceptable.

18. The system of claim 15, wherein the program is further adapted to calculate an amount of reticle tilt based upon positions of the reticle that result in the focus conditions of the predetermined images that best match each of the measured images.

19. The system of claim 13, wherein the program compares a first image of the measured images to the other measured images.

20. A computer-readable storage medium having program instructions operable for determining reticle tilt, the storage medium comprising:

measured test patter image data corresponding to measured images for each of a plurality of test patterns located on a semiconductor substrate;

predetermined test pattern image data corresponding to predetermined images of the test pattern for different focus conditions;

a first instruction that is adapted to control a scanning electron microscope such that the measured test pattern image data is produced; and a second instruction that is adapted to determine the reticle tilt to be acceptable or unacceptable depending on the measured test pattern image data.

21. The storage medium of claim 20, wherein the storage medium comprises a hard disk, a floppy disk, a read-only memory, and/or a random-access memory.

22. The storage medium of claim 20, wherein the focus conditions are predetermined to be acceptable or unacceptable.

23. The storage medium of claim 22, wherein the second instruction compares each of the measured images to the predetermined test pattern image data to determine the predetermined image that best matches each of the measured images.

24. The storage medium of claim 23, wherein each of the measured images best matches one of the predetermined images corresponding to acceptable focus conditions, and wherein the second instruction determines the reticle tilt to be acceptable.

25. The storage medium of claim 23, wherein at least one of the measured images best matches one of the predetermined images corresponding to unacceptable focus conditions, and wherein the second instruction determines the reticle tilt to be unacceptable.

26. The storage medium of claim 23, further comprising a third instruction that calculates an amount of reticle tilt based upon positions of the reticle that result in the focus conditions of the predetermined images that best match each of the measured images.

27. The storage medium of claim 20, wherein the second instruction compares a first image of the measured images to the other measured images.

* * * * *

UNITED STATES PATENT AND TRADEMARK OFFICE
CERTIFICATE OF CORRECTION

PATENT NO.   : 6,522,776 B1  
DATED        : February 18, 2003  
INVENTOR(S)  : Ehrichs It is certified that error appears in the above-identified patent and that said Letters Patent is hereby corrected as shown below:

Column 12,
Line 40, please remove "patter" and insert -- pattern -- thereafter.

Signed and Sealed this

Twenty-fourth Day of June, 2003

JAMES E. ROGAN
*Director of the United States Patent and Trademark Office*